(12) United States Patent
Wu

(10) Patent No.: US 6,277,694 B1
(45) Date of Patent: Aug. 21, 2001

(54) FABRICATION METHOD FOR A METAL OXIDE SEMICONDUCTOR HAVING A DOUBLE DIFFUSED DRAIN

(75) Inventor: Tsung-Chih Wu, Hsinchu Hsien (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/435,047

(22) Filed: Nov. 8, 1999

(51) Int. Cl.$^7$ .................................................. H01L 21/336
(52) U.S. Cl. ...................... 438/266; 438/210; 438/238; 438/253; 438/396
(58) Field of Search .................................. 438/200, 253, 438/254, 255, 266, 279, 396, 397, 398, 210, 238

(56) References Cited

U.S. PATENT DOCUMENTS 5,246,872 * 9/1993 Mortensen ........................... 438/200
5,920,774 * 7/1999 Wu ....................................... 438/224
6,008,081 * 12/1999 Wu ....................................... 438/210
6,187,619 * 2/2001 Wu ....................................... 438/224

* cited by examiner

Primary Examiner—Charles Bowers
Assistant Examiner—Asok Kumar Sarkar
(74) Attorney, Agent, or Firm—Thomas, Kayden, Horstemeyer & Risley, LLP

(57) ABSTRACT

A method for fabricating a metal oxide semiconductor having a double-diffused drain, which is applicable to the fabrication of an electrostatic discharge protection present fabrication method for a metal oxide semiconductor does not require additional masks. Only an additional ion implantation step is sufficient to form a double diffused drain metal-oxide-semiconductor for an electrostatic discharge protection circuit, in which the electrostatic discharge protective capability of the electrostatic discharge protection circuit is enhanced.

6 Claims, 5 Drawing Sheets

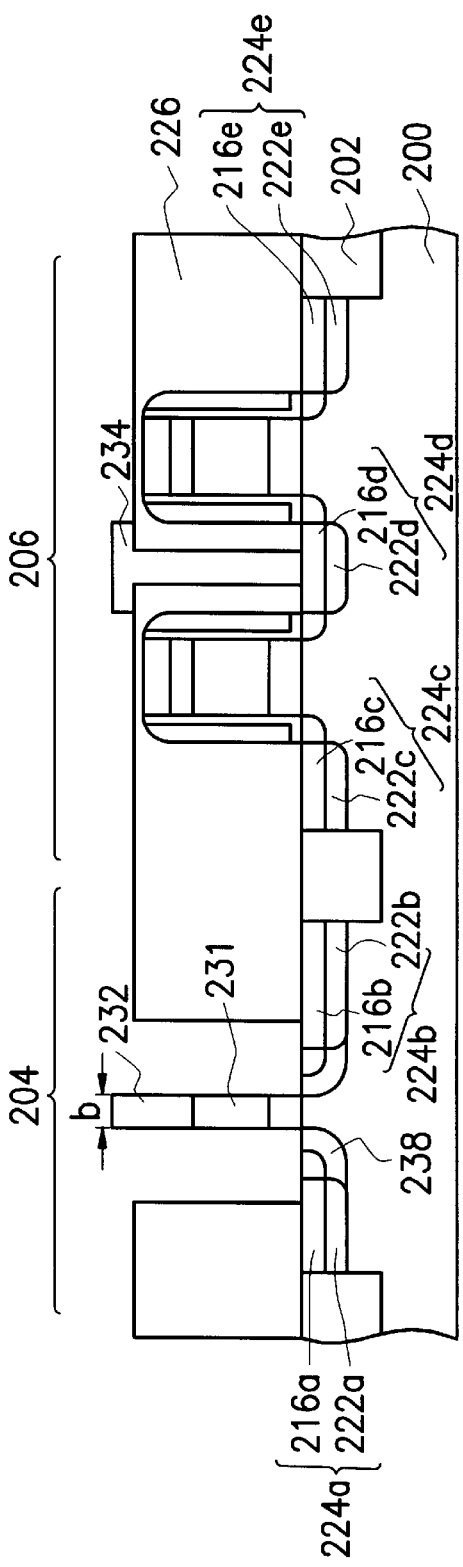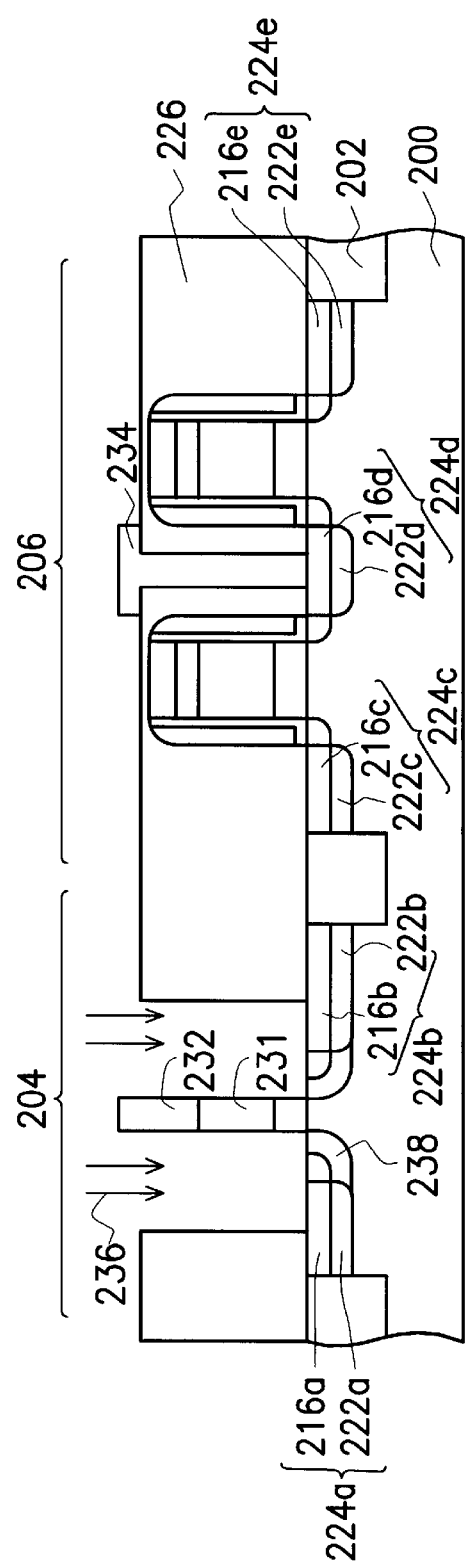

FABRICATION METHOD FOR A METAL OXIDE SEMICONDUCTOR HAVING A DOUBLE DIFFUSED DRAIN

BACKGROUND OF THE INVENTION

1. Field of the Invention

The present invention relates to a fabrication method for a metal oxide semiconductor (MOS) device comprising a double diffused drain (DDD). More particularly, the present invention relates to a fabrication method for an electrostatic discharge (ESD) protective circuit in a stacked dynamic random access memory (DRAM) device, in which the ESD protection circuit comprises a double diffused drain metal-oxide semiconductor device.

2. Description of the Related Art

During the fabrication of an integrated circuit, such as a dynamic random access memory device or a static random access memory (SRAM) device, or upon the completion of wafer fabrication, static electricity is one of most destructive factors that may induce damage in the integrated circuit. An electrical static discharge (ESD) protection circuit is therefore designed in the wafer to protect the wafer from damage due to external static electricity. Electrostatic damage often occur when a human body comes in contact with an electronic component, generating a high voltage surge, which causes serious damage to the electronic devices. For example, a human body walking on a carpet in a high humidity environment carries an electrostatic charge of about several hundred to about several thousand volts. The electrostatic charge can even exceed ten thousand volts in a low humidity environment. When an electrostatic charge carrier makes contact with a wafer, the electricity is released to the wafer and causes destruction of the wafer.

In the current design of an integrated circuit, the metal oxide semiconductor (MOS) in the integrated circuit comprising a lightly doped drain (LDD) is normally employed to prevent the generation of the hot carrier effect when the device dimensions are being reduced. The lightly doped drain of the metal oxide semiconductor, when being used as an electrical static discharge protection circuit, however, cannot provide the metal oxide semiconductor with sufficient protection from electrostatic discharge. The reason is summarized in the following.

FIG. 1 is a schematic, cross-sectional view of a metal oxide semiconductor comprising a lightly doped source/drain region. Referring to FIG. 1, the source/drain region 12 of the metal oxide semiconductor 10 comprises a lightly doped source/drain region 14. Since the dopant concentration in the lightly doped source/drain region 14 is lower, the electric field in the lightly doped source/drain region 14 is also weaker. As a result, the hot carrier effect generated at the channel 16 area is prevented when the dimensions of the metal oxide semiconductor are reduced.

Protection from electrostatic discharge, however, requires a higher electric field to discharge the high voltage static electrical charge. The metal oxide semiconductor comprising the lightly doped source/drain region mentioned in the above is inadequate for providing protection for an electrostatic discharge because the electric field at the lightly doped source/drain region is too weak.

SUMMARY OF THE INVENTION

Based on the foregoing, the current invention provides a fabrication method for a metal oxide semiconductor having a double-diffused drain, which can be used in an electrostatic discharge protection circuit of a stacked dynamic random access memory device. The fabrication method of the present invention does not require additional masks, and only one additional ion implantation step is needed to complete the fabrication of the electrostatic discharge protection circuit of a double-diffused drain metal oxide semiconductor device and to increase the protective ability of the metal oxide semiconductor from electrostatic discharge.

The current invention provides a fabrication method for a metal oxide semiconductor having a double-diffused drain, which is applicable to the electrostatic discharge protection circuit of a stacked DRAM device. The fabrication method according to the present invention includes providing a substrate, comprising an electrostatic discharge protection circuit or a memory cell region, wherein a first conductive layer and a first mask layer are sequentially formed on the substrate. A portion of the first conductive layer and a portion of the first mask layer are then removed to form, respectively, a first gate and a first source/drain region in the electrostatic discharge protection circuit, and a second gate and a second source/drain region in the memory cell region, wherein the first gate is formed by the second conductive layer and the second mask layer, and the first gate has a first width. A first lightly doped source/drain region which comprises a lightly doped and a second lightly doped source/drain region are formed, respectively, in the electrostatic discharge protection circuit region and the memory cell region. A first dielectric layer is then formed on the substrate, wherein the first dielectric layer comprises an opening to expose the first gate and a portion of the first source/drain region, and a second opening to expose a portion of the second source/drain region. A third conductive layer is then formed on the first dielectric layer, filling the first opening and the second opening. The third conductive layer is then patterned to form a third gate in the first source/drain region, and to form a second conductive layer in the second opening which is electrically connected to the second source/drain region in the second opening, wherein the third gate has a second width which is smaller than the first width. An ion implantation is further conducted to form a double-diffused drain region in the first source/drain region. Subsequently, the second dielectric layer is formed on the first dielectric layer, filling the first opening. A capacitor is further formed in the second dielectric layer of the memory cell region to electrically connect with the second source/drain region. Thereafter, a third dielectric layer is formed on the second dielectric layer. A conductive line is further formed in the third dielectric layer of the electrostatic discharge protection circuit region, wherein the conductive line is electrically connected with the first source/drain region of the double-diffused drain region.

According to the present invention, the formation of a MOS comprising a double-diffused source/drain region increases the electric field at the gate channel region, allowing the gate channel region to withstand the high voltage of the static electrical charge and to increase the preventive capability of the metal oxide semiconductor from electrostatic discharge. Furthermore, the fabrication method of the present invention does not require additional masks; only an extra ion implantation step is sufficient to form an electrostatic discharge protection circuit, which uses a double-diffused drain metal oxide semiconductor device. The electrostatic discharge prevention capability of the electrostatic discharge circuit is thereby enhanced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings, FIGS. 2A to 2H are schematic, cross-sectional views showing the fabrication of a metal oxide semiconductor comprising a double-diffused drain, which is applicable to an electrostatic discharge protection circuit in a stacked dynamic random access memory (DRAM) device according to the present invention.

DESCRIPTION OF THE PREFERRED EMBODIMENT

FIGS. 2A to 2H are schematic, cross-sectional views showing the fabrication of a metal oxide semiconductor comprising a double-diffused drain, which is applicable to an electrostatic discharge protection circuit in a stacked dynamic random access memory (DRAM) according to the present invention.

Figure 1:
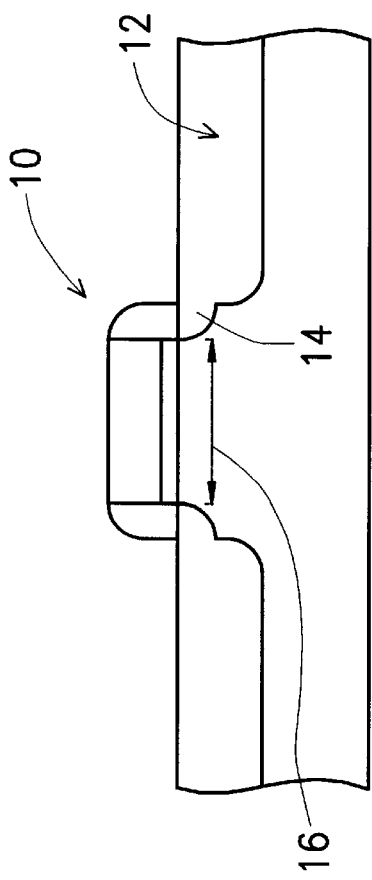
FIG. 1 is a schematic, cross-sectional view showing a metal oxide semiconductor comprising a lightly doped source/drain region according to the prior art.
Figure 2A:
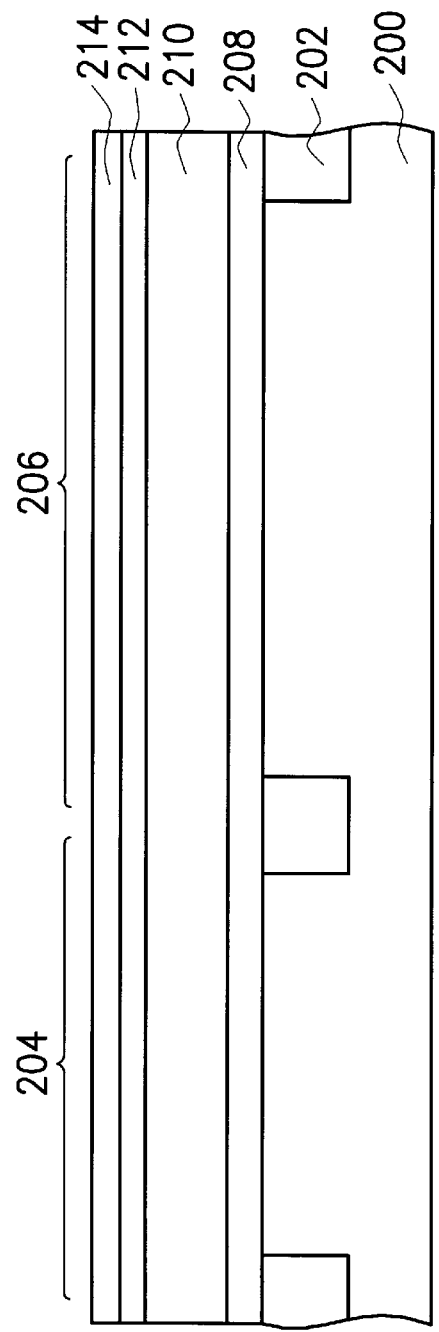

Referring to FIG. 2A, a gate oxide layer 208, a conductive layer 210, a dielectic layer 212 and a mask layer 214 are sequentially formed on a substrate 200 comprising device isolation structures 202. An electrostatic discharge protection circuit region 204 and a memory cell region 206 are defined on the substrate 200. The gate oxide layer 208 is formed by, for example, thermal oxidation, to a thickness of about 50 Å to about 500 Å. The conductive layer 210, the dielectric layer 212 and the mask layer 214 are formed by, for example, chemical vapor deposition (CVD). The conductive layer 210, for example, a polysilicon layer, is about 1500 to 2500 Å thick. The dielectric layer 212 is, for example, a buffer oxide layer, and the mask layer 214 is, for example, a silicon nitride layer.

Figure 2B:
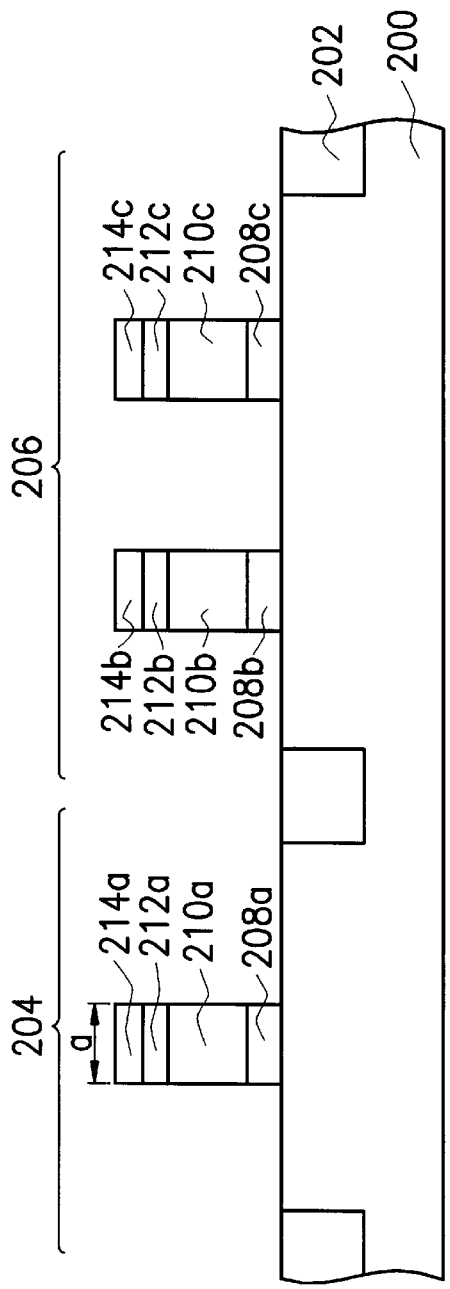

An anisotropic etching, for example, dry etching or reactive ion etching (RIE), is then conducted to form a gate oxide layer 208a, a conductive layer 210a, a dielectric layer 212a and a mask layer 214a in the electrostatic discharge protection circuit region as shown in FIG. 2B, wherein the gate oxide layer 208a, the conductive layer 210a, the dielectric layer 212a and the mask layer 214a have a width of about "a". In the same etching process, gate oxide layers 208b and 208c, conductive layers 210b and 210c, dielectric layers 212b and 212c, and mask layers 214b and 214c are formed in the memory cell region 206.

Figure 2C:
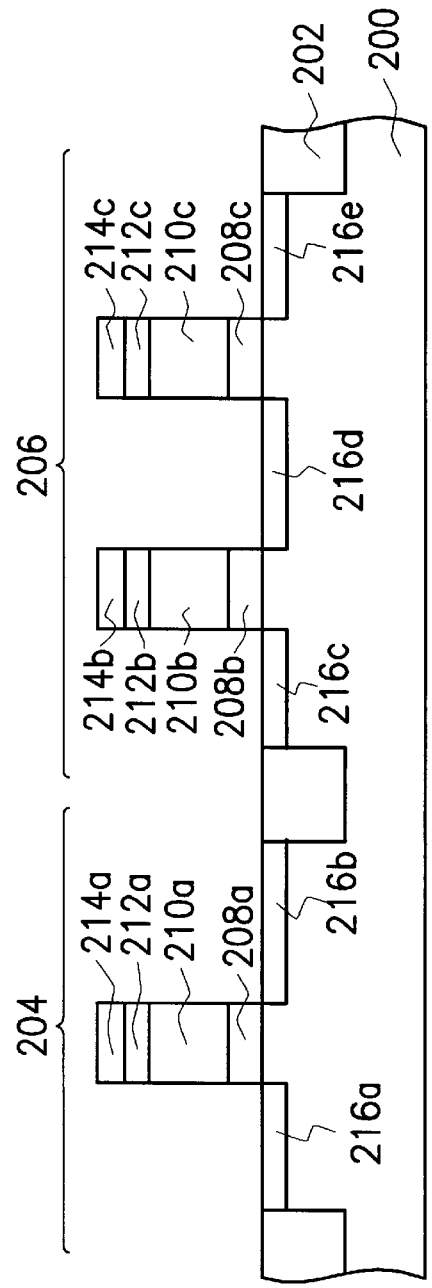

Referring to FIG. 2C, a light doping process is conducted to form the lightly doped source/drain regions 216a and 216b in the electrostatic discharge protection circuit region 204, and the lightly doped source/drain regions 216c, 216d, and 216e in the memory cell region.

Figure 2D:
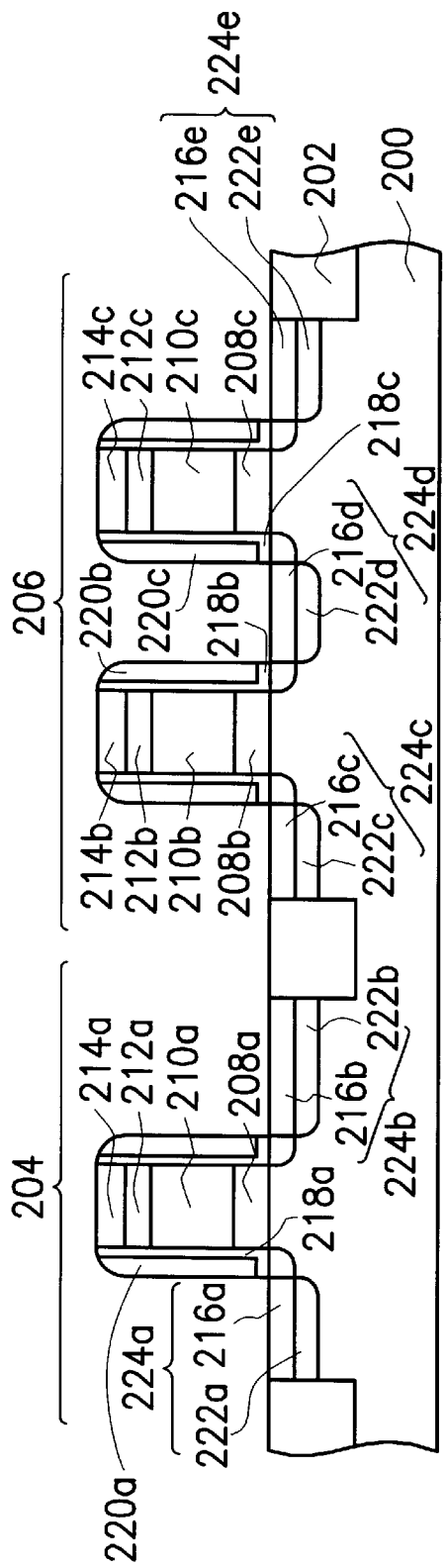

Continuing to FIG. 2D, buffer layers 218a, 218b, 218c are further formed on the sidewalls of gate oxide layers 208a, 208b, 208c, the conductive layers 210a, 210b, 210c, the dielectric layers 212a, 212b, 212c and the mask layers 214a, 214b, 214c, and on a portion of the substrate 200 surface. The buffer layers 218a, 218b, 218c, made of, for example, silicon dioxide, are formed by forming a conformal silicon dioxide layer on the substrate 200, followed by an anisotropic etching to remove a portion of the silicon dioxide layer. Mask layers 220a, 220b, 220c are further formed on the buffer layers 218a, 218b, 218c, respectively. The mask layers 220a, 220b, 220c, made of a material such as silicon nitride, are formed by forming a conformal silicon nitride layer on the substrate 200, followed by conducting an anisotropic etching to remove a portion of the silicon nitride layer, leaving on the silicon nitride layer on the buffer layers 218a, 218b, 218c.

Thereafter, a heavily doping process is conducted to form heavily doped source/drain regions 222a, 222b in the electrostatic discharge protection circuit region 204, and heavily doped source/drain regions 222c, 222d, 222e in the memory cell region 206. The lightly doped source/drain regions 216a, 216b, 216c, 216d, 216e together with, respectively, the heavily doped source/drain regions 222a, 222b, 222c, 222d and 222e form the source/drain regions 224a, 224b, 224c, 224d, 224e as shown in FIG. 2D. The above light and heavy doping process are familiar to those who are skilled in the arts and will not be reiterated in the present embodiment.

Figure 2E:
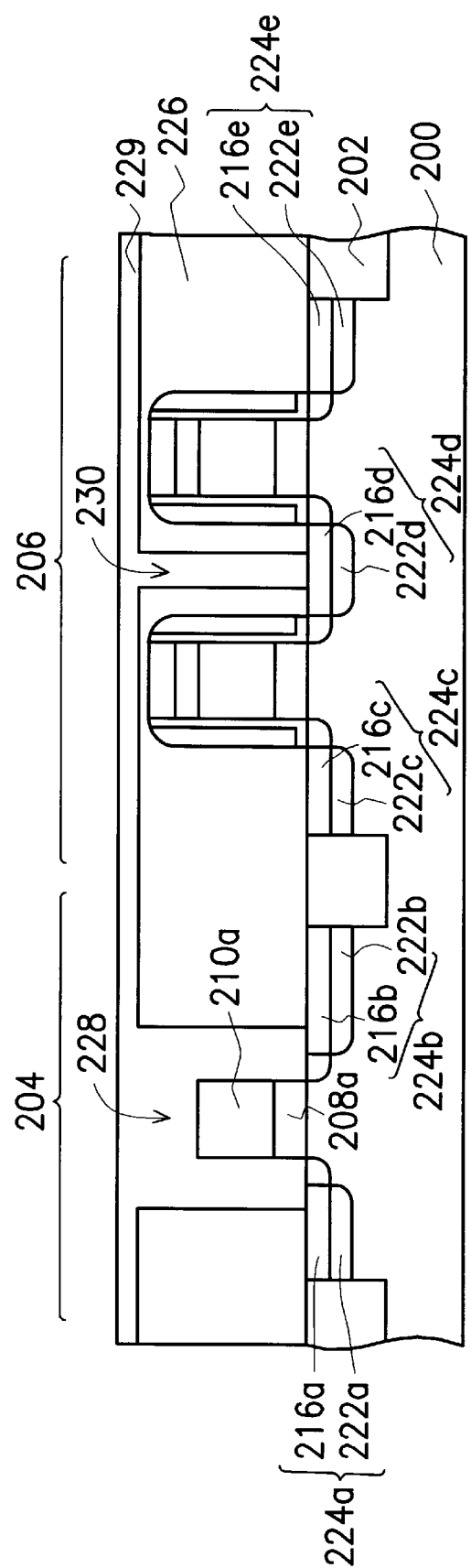

Referring to FIG. 2E, a dielectric layer 226 is formed on the substrate 200, followed by forming the openings 228 and 230 in the dielectric layer 226. The mask layers 214a, 220a, the buffer layer 218a and the dielectric layer 212a are further removed. Consequently, the opening 228 exposes a portion of the source/drain regions 224a, 224b and the conductive layer 210a, whereas the opening 230 exposes a portion of the source/drain region 224d. The dielectric layer 226, such as silicon dioxide, are then formed by, for example, atmospheric pressure chemical vapor deposition (APCVD). A conductive layer 229 is further formed on the dielectric layer 226, filling the openings 228 and 230.

Referring to FIG. 2F, conductive layers 231, 232, 234 are formed, for example, by forming a patterned photoresist layer on the conductive layer 229 (as in FIG. 2E), followed by anisotropic etching to remove a portion of the conductive layer 210a and the conductive layer 229. The conductive layer 231 and the conductive layer 232 with a width of about "b" are formed in the opening 228; and the conductive layer 234 formed in the opening 230 is electrically connected to the source/drain region 224d. The width "b" is less the width "a" (as in FIG. 2B), and "a" is about 1.3 to 1.5 times greater than "b". Since the widths of the conductive layers 231, 232 are smaller, a portion of the substrate 200 surface, which is not doped, is exposed.

A heavy doping process 236 is then conducted as illustrated in FIG. 2G to form a double diffused source/drain region 238 in the electrostatic discharge protection circuit region 204. The dosage of the implanted ions and the depth of the implantation for this heavy doping process 236 are greater than those used in forming the lightly doped source/drain regions 216a, 216b, 216c, 216d, 216e (as in FIG. 2C), and are about equal to those used in forming the heavily doped source/drain regions 222a, 222b, 222c, 222d, 222e (as in FIG. 2D).

Figure 2H:
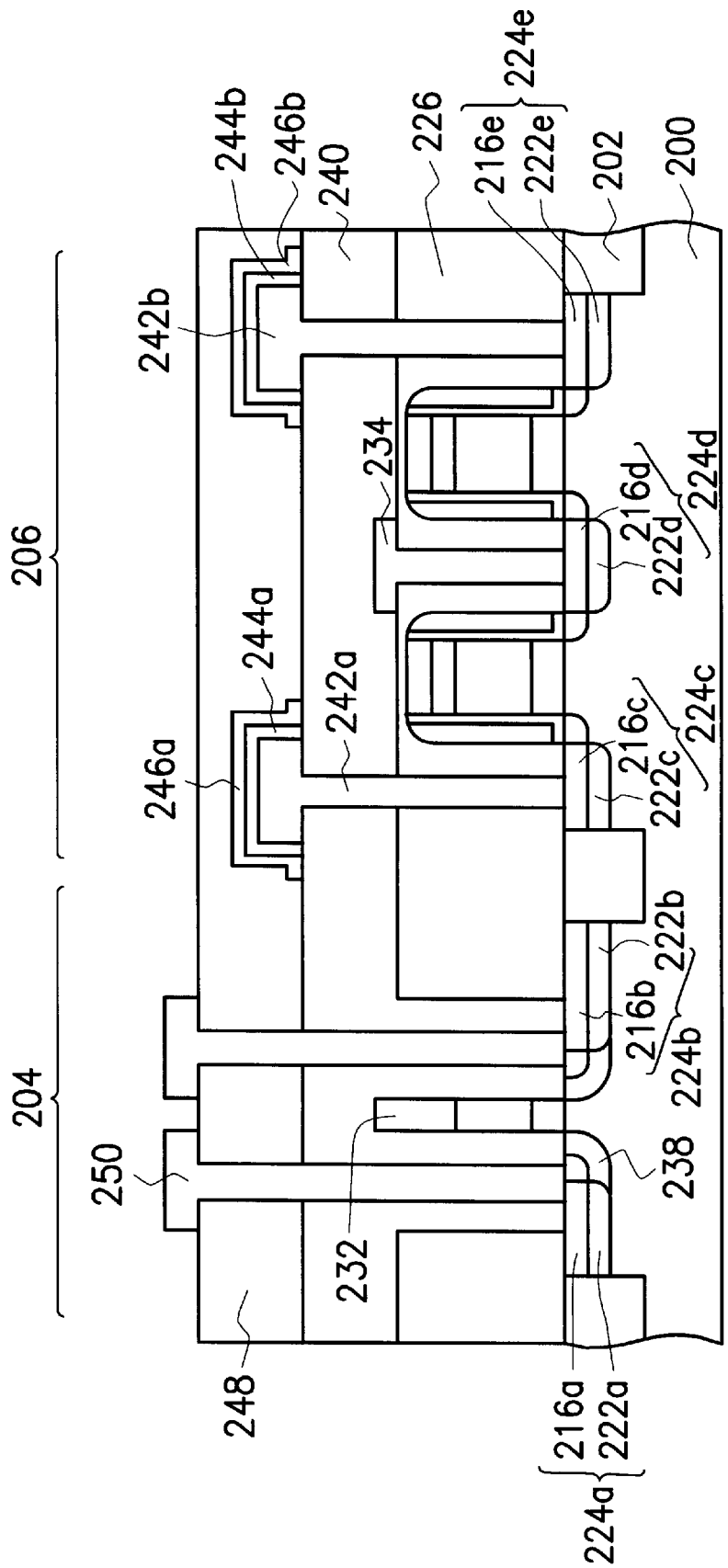

After this, as shown in FIG. 2H, a dielectric layer 240 is formed on the substrate 200, and exposes the source/drain regions 224c, 224e in the memory cell region 206 and the source/drain regions 224a, 224b in the electrostatic discharge protection circuit region 204. Bottom electrodes 242a, 242b are then formed in the memory cell region 206, which are electrically connected with, respectively, the source/drain regions 224c, 224e. The dielectric layers 244a, 244b and the upper electrodes 246a, 246b are then sequentially formed on the bottom electrodes 242a, 242b, respectively, to form a capacitor structure of the dynamic random access memory device. Thereafter, a patterned dielectric layer 248 is formed on the dielectric layer 240, followed by forming the conductive lines 250, which are electrically connected with the double diffused source/drain region 238. The above processes of forming a capacitor and conductive lines are familiar to those who are skilled in the art, and thus will not be reiterated in the present embodiment.

According to the preferred embodiment of the present invention, a metal oxide semiconductor device comprising a double diffused source/drain region is formed in the electrostatic discharge protection circuit region of a stacked type dynamic random access memory device. Since the extent of doping in the channel region of the metal oxide semiconductor is higher, a higher electric field is then present at the channel region to tolerate a higher voltage of the static electricity. The protective capability of the electrostatic discharge protection circuit is thereby increased.

The present invention is applicable to the fabrication of a stacked type dynamic random access memory device, in which the formation of a double diffused source/drain metal-oxide-semiconductor device as the electrostatic discharge protection circuit does not require additional masks. Only an additional of ion implantation process step is needed to increase the protective capability of the electrostatic discharge protection circuit.

It will be apparent to those skilled in the art that various modifications and variations can be made to the structure of the present invention without departing from the scope or spirit of the invention. In view of the foregoing, it is intended that the present invention cover modifications and variations of this invention provided they fall the scope of the following claims and their equivalents.

What is claimed is:

1. A fabrication method for a metal oxide semiconductor having a double-diffused drain, which is applicable to an electrostatic discharge protection circuit for a stacked type dynamic random access memory device, and is applicable to a substrate comprising an electrostatic discharge protection circuit region and a memory cell region, the method comprising the steps of:

sequentially forming a first conductive layer and a first mask layer on the substrate;

forming a first gate in the electrostatic discharge protection circuit region and a second gate in the memory cell region by removing a portion of the first conductive layer and a portion of the first mask layer, wherein the first gate is formed with a second conductive layer and a second mask layer, wherein the second conductive layer is a remaining portion of a first conductive layer, the second mask is a remaining portion of the first mask layer, and the first gate has a first width;

forming a first source/drain region comprising a lightly doped drain region and a second source/drain region comprising a lightly doped drain region in the electrostatic discharge protection circuit region and the memory cell region, respectively;

forming a first dielectric layer on the substrate, wherein the first dielectric layer comprises a first opening which exposes a first gate and a portion of the first source/drain region surrounding the gate, and a second opening which exposes a portion of the second source/drain region, between two gates;

removing the second mask layer;

forming a third conductive layer on the first dielectric layer, wherein the third conductive layer fills the first opening and the second opening;

patterning the third conductive layer to form a third gate by selectively etching the first gate and to form a fourth conductive layer in the second opening to electrically connect with the second source/drain region, wherein the third gate comprises a second width which is less than the first width;

forming a double diffused drain region in the first source/drain region by conducting an ion implantation process;

forming a second dielectric layer on the first dielectric layer and filling the first opening;

forming a capacitor in the second dielectric layer of the memory cell region to electrically connected with the second source/drain region;

forming a third dielectric layer on the second dielectric layer; and forming a conductive line in the third dielectric layer of the electrostatic discharge protection circuit region which is electrically connected to the first source/drain region of the double diffused drain region.

2. The fabrication method for a metal oxide semiconductor having a double-diffused drain according to claim 1, wherein the first width is width is about 1.3 to 1.5 time greater than the second width.

3. The fabrication method for a metal oxide semiconductor having a double-diffused drain according to claim 1, wherein a dosage of implanted ions and a depth of implantation for the step of ion implantation process are greater than the dosage of the implanted ions and the depth implantation for the first source/drain region.

4. A fabrication method for a metal oxide semiconductor device comprising a double diffused drain, which is applicable to a stacked type dynamic random access memory device, the method comprising the steps of:

providing a substrate comprising an electrostatic discharge protection circuit region and a memory cell region;

forming a first gate in the electrostatic discharge protection circuit region and a second gate in the memory cell region, wherein the first gate comprises a first width.

forming a first source/drain region comprising a lightly doped drain region and a second source/drain region comprising a lightly doped drain region in the electrostatic discharge protection circuit region and in the memory cell region, respectively;

forming a first dielectric layer on the substrate, wherein the first dielectric layer has an opening which exposes the first gate and a portion of the first source/drain region surrounding the gate, and has a second opening which exposes a portion of the second source/drain region;

forming a first conductive layer on the first dielectric layer which fills the first opening and the second opening;

patterning the first conductive layer to form a third gate by selectively etching the first gate in the first opening and to form a second conductive layer in the second opening which is electrically connected to the second source/drain region, wherein the third gate has a second width; and conducting an ion implantation to form a double diffused drain region in the first source/drain region.

5. The fabrication method for a metal oxide semiconductor having a double-diffused drain according to claim 4, wherein the first width is about 1.3 to about 1.5 times greater than the second width.

6. The fabrication method for a metal oxide semiconductor having a double-diffused drain according to claim 4, wherein a dosage of ions and a depth of implantation in the step of ion implantation is greater than the dosage of the ions and the depth of implantation in the lightly doped region of the first source/drain region.

* * * * *